US005087830A

United States Patent [19]

Cave et al.

[11] Patent Number: 5,087,830
[45] Date of Patent: Feb. 11, 1992

[54] START CIRCUIT FOR A BANDGAP REFERENCE CELL

[76] Inventors: David Cave, 5-8 Ooyama-cho, Shibuya-ku 151, Tokyo, Japan; Michael D. Gadberry, 1810 E. Randall Dr., Tempe, Ariz. 85281

[21] Appl. No.: 354,574

[22] Filed: May 22, 1989

[51] Int. Cl.[5] .......................... H03K 3/01; H03K 5/22

[52] U.S. Cl. .............................. 307/296.6; 307/296.7; 307/491; 307/495; 323/314

[58] Field of Search .................. 307/296.6, 296.7, 491, 307/495; 323/313-315

[56] References Cited

U.S. PATENT DOCUMENTS 3,648,154 3/1972 Frederiksen et al. ............... 323/313
4,085,359 4/1978 Ahmed ............................... 323/314
4,287,439 9/1981 Leuschner ........................ 307/296.6
4,380,706 4/1983 Wrathall .......................... 307/296.6
4,476,428 10/1984 Iwasawa et al. .................... 323/314
4,740,742 4/1988 Gontowski, Jr. ................... 323/313
4,839,535 6/1989 Miller .............................. 307/296.7
4,857,823 8/1989 Bitting ................................ 323/314

*Primary Examiner*—Stanley D. Miller
*Assistant Examiner*—Richard Roseen

[57] ABSTRACT

A start circuit for a bandgap reference cell using CMOS transistors including a transistor connected between the bandgap reference cell and a differential amplifier in the feedback path to create an offset voltage in the bandgap reference cell when power is first applied, which offset insures the correct operation of the bandgap reference cell, and to turn off after correct operation has been achieved.

6 Claims, 1 Drawing Sheet

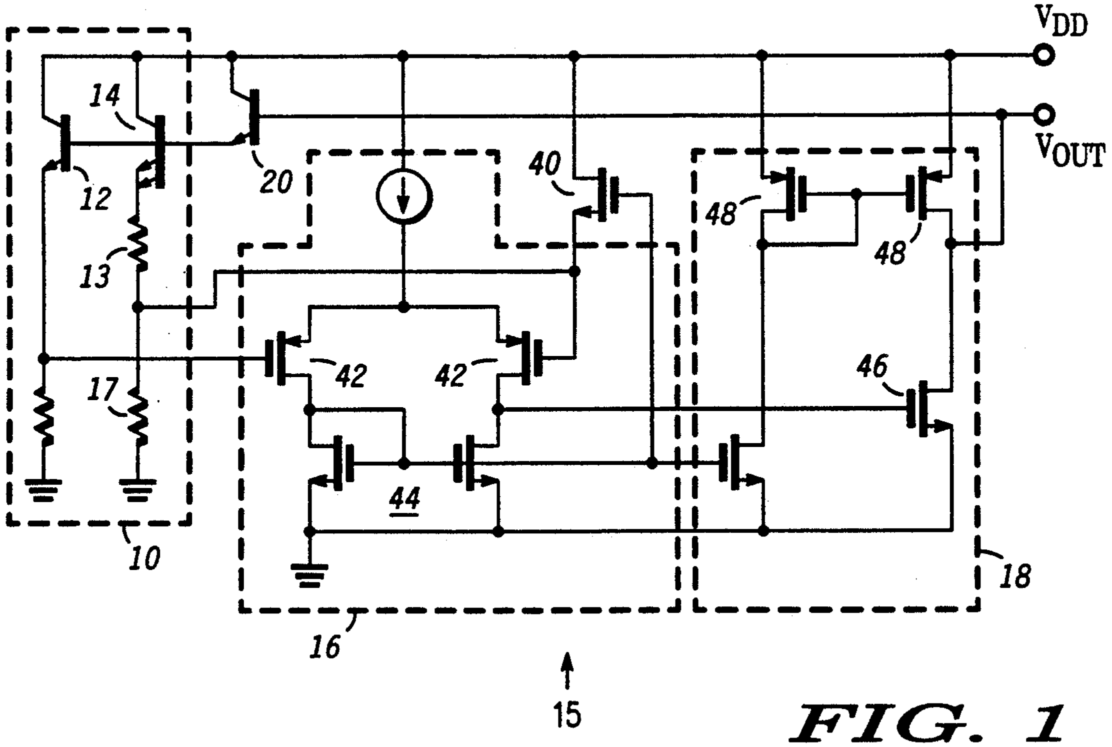
FIG. 1
FIG. 2A
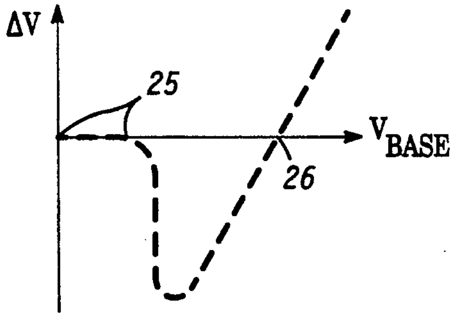
FIG. 2B
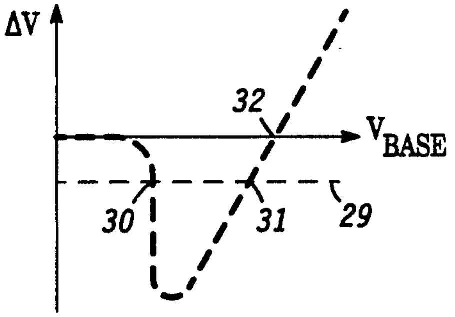
FIG. 2C
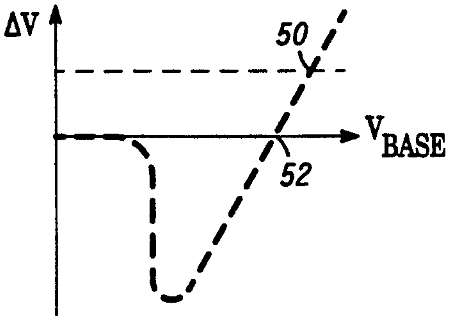

START CIRCUIT FOR A BANDGAP REFERENCE CELL

The present invention pertains to a start circuit for a bandgap reference cell using CMOS transistors and more particularly to apparatus and method for starting a bandgap reference cell by introducing an offset voltage.

BACKGROUND OF THE INVENTION

Bandgap reference cells are well known in the art. A complete explanation of the construction and operation of such cells is available in U.S. Pat. No. 3,887,863, entitled "Solid-State Regulated Voltage Supply", issued June 3, 1975. One initial problem with the Brokaw cell, as described in the above patent, is that it only operated with bipolar transistors. Eventually, the cell was adapted for the use of complimentary metal oxide (CMOS) type transistors. The standard method of producing a CMOS bandgap reference cell is to utilize parasitic NPN (P-well) bipolar transistors having collectors common with the voltage terminal. The problem that arose with bandgap reference cells employing CMOS transistors was the starting and operation of the cell. Most bandgap reference cells have two operating points: in the case of bipolar transistors they are zero and the correct (bandgap voltage) output, and in the case of CMOS transistors they may be zero or a small negative voltage and the correct (bandgap voltage) output. Many attempts have been made at designing satisfactory start circuits but they are either too complicated and expensive or they consume too much power.

SUMMARY OF THE INVENTION

It is an object of the present invention to provide a new and improved start circuit for a bandgap reference cell using CMOS transistors.

It is another object of the present invention to provide a start circuit for and a method of starting a bandgap reference cell which is reliable, simple and cheap to manufacture and use.

It is another object of the present invention to provide a start circuit for a bandgap reference cell which, once the bandgap reference cell has started, becomes transparent, i.e. the start circuit draws no current, creates no offset, etc.

It is another object of the present invention to provide a start circuit for a bandgap reference cell which can easily and efficiently be incorporated into an integrated circuit.

These and other objects of this invention are realized in a bandgap reference cell including a start circuit which introduces an offset voltage into the cell upon application of power to the cell, the offset driving the cell toward the correct output and preventing the cell from moving to the operating point at which a small negative voltage or no voltage output is produced.

Detailed Description of the Drawing

Referring to the drawings:

FIG. 1 is a schematic drawing of a bandgap reference cell and start circuit incorporating the present invention; and FIG. 2A through FIG. 2C illustrate graphically various starting points of bandgap reference cells, including the circuit of FIG. 1.

DESCRIPTION OF THE PREFERRED EMBODIMENT

Referring to FIG. 1, a bandgap reference, designated 10, provides the bandgap reference voltage with substantially zero temperature coefficient as described in the '863 patent cited above. Circuit 10 includes a pair of parasitic bipolar transistors 12 and 14 which, because of the construction thereof must have the collectors directly connected to the positive voltage supply (VDD). Thus, control signals are taken from the emitter circuits in the form of a differential pair of outputs. One of the differential pair of outputs is taken directly from the emitter of transistor 12 and the other output of the pair is taken from the junction of two resistors 13 and 17, which are connected in series from the emitter of transistor 14 to a reference potential. The differential pair of outputs are applied to a pair of input terminals of a differential amplifier, generally designated 15. Amplifier 15 includes a first stage 16, with differential inputs and differential outputs, and a second stage 18, with differential inputs and a single ended output. The single ended output of amplifier 15 is the output voltage of the bandgap reference cell and is also fed back through a buffer amplifier 20 to a common base connection of the two bipolar transistors 12 and 14. The feedback circuit is responsive to current flow through transistors 12 and 14 and automatically adjusts the base voltages to maintain a predetermined ratio of current density for transistors 12 and 14. Generally, transistor 14 is constructed with a larger emitter than transistor 12 so that an increase in base current produces a larger increase of current in transistor 14 and, consequently, an increase in output voltage from the cell.

The bandgap reference cell including circuit 10, amplifier 15 and buffer amplifier 20 may have several starting points, as mentioned above. In general, if the various components are well matched and the circuit is properly constructed to operate as a bandgap reference cell there should be no offset voltages therein and a plot of the difference voltage between the two outputs of circuit 10 versus the base voltage at the common bases of transistors 12 and 14 is illustrated in FIG.2A. From this plot it can be seen that the bandgap reference cell has two stable points at which it can operate. The two points are zero, in the area 25, and anywhere in the region from zero in the area 25 to the correct operating point 26 at which the circuit is designed to operate. The purpose of starting circuits is to push operation beyond area 25, making point 26 the only viable solution.

If through some flaw, manufacturing tolerance, or change in components amplifier 15 has a negative offset voltage, the plot shown in FIG. 2B applies, where the line 29 indicates the offset voltage. Now it can be seen that the bandgap reference cell has two different points at which it could operate. The first is a small negative voltage, designated by number 30 and the second is a point slightly off the designed operating point, designated by the number 31. It is not uncommon to have such offsets in amplifiers, especially if the amplifiers are constructed as a portion of an integrated circuit. In the event that the offsets become relatively large, points 30 and 31 move closer together and the difficulty of starting the circuit at the proper point increases substantially.

The above problem is overcome by including a CMOS transistor 40 in the cell, as illustrated in FIG. 1. In this embodiment first stage 16 of amplifier 15 receives the differential output signals from circuit 10 at the control electrodes of a differentially connected pair of transistors 42. A current mirror 44 is connected in the collector circuits of transistors 42 and provides an output to a transistor 46 in second stage 18 of amplifier 15. It should be noted that current mirror 44 is made up of a pair of N type CMOS transistors and transistor 40 is also an N type CMOS transistor. A pair of transistors 48 make up a current mirror in the collector circuits of transistors 46. Transistor 40 is connected into this circuit by connecting the control electrode thereof to the control electrodes of transistors 44 in amplifier 15, a second electrode thereof to the differential output from the emitter circuit of transistor 14, and a third electrode thereof to the supply terminal adapted to have VDD supplied thereto.

In the operation of the present circuit, when VDD is applied to the supply terminal transistor 40 begins to conduct through resistor 17 in the emitter circuit of transistor 14. This current develops an offset voltage which is applied to amplifier 15 and a base current is applied to the common connected bases of transistors 12 and 14. The base current supplied to these transistors starts the cell with a positive offset voltage, as illustrated by point 50 of FIG. 2C. The cell is then limited to dropping back to the correct operating point 52. Once the cell has begun operation the control electrode of transistor 40 is at approximately the same potential as the second electrode and transistor 40 is cutoff. Thus, transistor 40 is, practically, no longer in the cell and the offset voltage is eliminated so that the cell can operate correctly and with out consuming additional power.

If the bandgap reference cell has a negative offset voltage because of something in the construction (as described above), the operating curve might appear as a combination of curves illustrated in FIGS. 2B and 2C. In this situation the circuit might attempt to start at point 30 or 31. When this happens, resistor 17 is at a zero potential and the gate of transistor 40 is up, referenced to transistors 44. Thus transistor 40 begins to conduct current through resistor 17 and creates an offset voltage in amplifier 15, which increases the conduction of the transistor forming buffer amplifier 20 and forces the operating point to shift to point 32 (52). In this embodiment transistor 40 is an N type CMOS transistor and, since the bias for the control electrode is developed from devices of a similar type, sensitivity to processing is reduced. Although the invention is described by utilizing a specific type of bandgap reference cell as an example, it will be understood that mere changes in transistor type and in the specific amplifier used are electrical equivalents and well within the scope of the invention.

Thus, a start circuit for a bandgap reference cell is illustrated and disclosed, which start circuit is relatively simple and inexpensive to incorporate into a cell. Further, because the start circuit operates on the basis of introducing an offset into the cell, it can overcome problems, such as a negative offset, which may cause prior art start circuits to operate in a random fashion. Also, by utilizing a compatible type of transistor in the start circuit processing sensitivity can be reduced to further simplify production.

While we have shown and described specific embodiments of the present invention, other improvements and modifications may occur to those skilled in the art. We desire it to be understood, therefore, that this invention is not limited to the particular forms shown and we intend in the appended claims to cover all modifications which do not depart from the spirit and scope of this invention.

What is claimed is:

1. A bandgap reference cell with a start circuit comprising:

a pair of bipolar transistors connected into a bandgap reference cell having bases connected in common providing an input and a pair of output terminals providing output voltages proportional to current flowing in each of said pair of bipolar transistors, respectively;

a differential amplifier having a pair of inputs and a single ended output, said pair of inputs being connected to said pair of output terminals of said pair of bipolar transistors, and said single ended output being connected as an output of the bandgap reference cell and also to said bases of said pair of bipolar transistors; and an offset transistor having a control electrode connected to said differential amplifier, a second electrode coupled to one of said pair of output terminals of said pair of bipolar transistors and a third electrode coupled to a power supply input terminal, so that said offset transistor produces an offset voltage in said pair of bipolar transistors when power is supplied to said power supply input terminal and said control electrode turns off said offset transistor when said differential amplifier is turned on by said pair of bipolar transistors.

2. A bandgap reference cell with a start circuit as claimed in claim 1 wherein one of said pair of bipolar transistors has a larger emitter area than the other one to conduct a greater amount of current than the other as current is increased to said bases of said pair of bipolar transistors, and the second electrode of said offset transistor is coupled to said output terminal of the one of said pair of bipolar transistors which conducts the greater amount of current.

3. A bandgap reference cell with a start circuit as claimed in claim 1 wherein said differential amplifier includes a first stage having a pair of transistors providing a differential output and a second stage having a pair of transistors receiving a differential input, and the pairs of transistors in the first and second stages of said differential amplifier are the same type of conductivity as said offset transistor.

4. In a bandgap reference cell including a pair of transistors connected to supply an input voltage to a differential amplifier which in response thereto supplies to the pair of transistors a control voltage lying in a range between a first output that drives the pair of transistors toward a higher output voltage and a second output that drives the pair of transistors toward a lower output voltage, said cell having a potential for starting in either a correct mode or an incorrect mode, a method of starting the cell in the correct mode comprising the steps of:

applying a supply voltage to the cell;

developing an offset voltage associated with the input voltage supplied to the differential amplifier to drive the pair of transistors toward the correct mode of operation; and removing the offset voltage when the cell is started.

5. A method of starting a bandgap reference cell as claimed in claim 4 wherein the step of developing an offset voltage to drive the pair of transistors toward the correct mode includes developing an offset voltage to drive the pair of transistors toward a higher output voltage.

6. In conjunction with a bandgap reference cell including two parasitic bipolar transistors connected to supply at a pair of output terminals a pair of differential output voltages to a differential amplifier which in response thereto supplies to the two parasitic bipolar transistors a control voltage lying in a range between a first output that drives the two parasitic bipolar transistors toward a higher output voltage and a second output that drives the two parasitic bipolar transistors toward a lower output voltage, said cell having a potential for starting in either a correct mode or an incorrect mode, a starting circuit comprising an offset transistor having a control electrode connected to the differential amplifier, a second electrode coupled to one of the pair of output terminals of said two parasitic bipolar transistors and a third electrode coupled to a power supply terminal, so that said offset transistor produces an offset in said two parasitic bipolar transistors and differential amplifier when power is supplied to the power supply terminal and the control electrode turns off said offset transistor when the cell and included differential amplifier are turned on by said two parasitic bipolar transistors.

* * * * *